(12) United States Patent
Pandita (10) Patent No.: US 9,520,872 B2
(45) Date of Patent: Dec. 13, 2016

(54) LINEAR EQUALIZER WITH VARIABLE GAIN

(71) Applicant: QUALCOMM Incorporated, San Diego, CA (US)

(72) Inventor: Bupesh Pandita, Raleigh, NC (US)

(73) Assignee: QUALCOMM Incorporated, San Diego, CA (US)

(*) Notice: Subject to any disclaimer, the term of this patent is extended or adjusted under 35 U.S.C. 154(b) by 101 days.

(21) Appl. No.: 14/581,820

(22) Filed: Dec. 23, 2014

(65) Prior Publication Data

US 2016/0182038 A1 Jun. 23, 2016

(51) Int. Cl.
| | |
|---|---|
| H03K 3/00 | (2006.01) |
| H03K 17/687 | (2006.01) |
| H03F 3/45 | (2006.01) |
| H04L 25/03 | (2006.01) |
| H04L 25/02 | (2006.01) |

(52) U.S. Cl.
CPC ........ H03K 17/687 (2013.01); H03F 3/45183 (2013.01); H04L 25/03878 (2013.01); *H03F 2203/45631* (2013.01); *H03F 2203/45712* (2013.01); *H03F 2203/5006* (2013.01); *H04L 25/028* (2013.01); *H04L 25/0272* (2013.01)

(58) Field of Classification Search
None
See application file for complete search history.

(56) References Cited

U.S. PATENT DOCUMENTS

| | | | |
|---|---|---|---|
| 6,937,054 B2* | 8/2005 | Hsu | H04L 25/0272 326/115 |
| 7,183,832 B1* | 2/2007 | Voo | H03F 3/45179 326/81 |
| 7,368,981 B2* | 5/2008 | Miyagi | H03F 1/26 327/552 |
| 7,536,114 B2* | 5/2009 | Gieseler | H03F 3/45085 250/214 AG |
| 7,560,957 B2 | 7/2009 | Chen et al. | |
| 7,697,601 B2 | 4/2010 | Mansuri et al. | |
| 8,200,179 B1 | 6/2012 | Mosinskis et al. | |
| 8,928,362 B2* | 1/2015 | Kimura | 327/108 |
| 2013/0049806 A1* | 2/2013 | Koyama | H03K 19/01714 326/68 |
| 2013/0187717 A1* | 7/2013 | Murphy | H03F 3/3022 330/304 |
| 2014/0247089 A1* | 9/2014 | Van Praet | H03H 11/0405 327/552 |
| 2014/0266379 A1* | 9/2014 | Inoue | G11C 27/024 327/307 |

OTHER PUBLICATIONS

International Search Report and Written Opinion—PCT/US2015/063003—ISA/EPO—Apr. 15, 2016.

(Continued)

*Primary Examiner* — Lincoln Donovan
*Assistant Examiner* — Khareem E Almo
(74) *Attorney, Agent, or Firm* — Haynes and Boone, LLP (57) ABSTRACT

A linear equalizer is configured with load transistors that load a corresponding differential pair of transistors. The linear equalizer is configured to selectively diode connect each load transistor to boost a high frequency gain.

18 Claims, 5 Drawing Sheets

(56) References Cited

OTHER PUBLICATIONS

Musah T et al., "A 4-32 Gb/s Bidirectional Link With 3-Tap FFE/6-Tap DFE and Collaborative CDR in 22 nm CMOS", IEEE Journal of Solid-State Circuits, IEEE Service Center, Piscataway, NJ, USA, XP011564892, Dec. 1, 2014, vol. 49, No. 12, pp. 3079-3090, ISSN: 0018-9200, DOI: 10.1109/JSSC.2014.2348556 [retrieved on Nov. 20, 2014].
Sonna P., et al., "Broadband Programmable Equalizer and Limiting Amplifier for an XFI Interface in 45nm CMOS", Proceedings of the Argentine School of Micro-Nanoelectronics, Technology and Applications, 2009, EAMTA, IEEE, Piscataway, NJ, USA, XP031930107, Oct. 1, 2009, pp. 77-80, ISBN: 978-1-4244-4835-7.
Chen J., et al., "Electrical Backplane Equalization Using Programmable Analog Zeros and Folded Active Inductors," IEEE Transactions on Microwave Theory and Techniques, Jul. 2007, vol. 55, No. 7, pp. 1459-1466.
Razavi B., "Design of Integrated Circuits for Optical Communications," 2nd ed. Chapter 5, Wesley, 2012, pp. 130-184.
Sackinger E., et al., "A 3-GHz, 32-dB CMOS Limiting Amplifier for SONET OC-48 Receivers," ISSCC Dig. Tech. Papers, Feb. 2000, pp. 158-159.
Wang H., et al., "A 21-Gb/s 87-mW Transceiver with FFE/DFE/ Analog Equalizer in 65-nm CMOS Technology," IEEE Journal of Solid-State Circuits, Apr. 2010, vol. 45, No. 4, pp. 909-920.

\* cited by examiner

LINEAR EQUALIZER WITH VARIABLE GAIN

TECHNICAL FIELD

This application relates to equalizers, and more particularly to linear equalizers with variable gain.

BACKGROUND

Modern microprocessors operate on wide-bit words. For example, it is conventional for some microprocessors to process 64-bit words. As processor clock rates increase ever higher, the routing of such relatively wide-bit words on wide-bit buses becomes problematic. At high transmission speeds, the inevitable skew with regard to propagation on separate traces in the wide-bit buses may lead to unacceptable bit error rates. Moreover, such buses demand a lot of power and are expensive to design.

To enable the high-speed transmission of relatively-wide data words without the skew and distortion issues associated with high-speed wide-bit buses, serializer-deserializer (SERDES) systems have been developed. A SERDES transmitter serializes the data words into a high-speed serial data stream. A SERDES receiver receives the high-speed serial data stream and deserializes it back into the parallel data words. The serial transmission is usually differential and includes an embedded clock. The skew and distortion issues associated with high-speed wide-bit data buses are thus abated.

Although SERDES systems enable very high-speed data transmission such as 10 gigabits per second or even higher rates, the transmission characteristics for the differential serial data channel between the transmitter and receiver are not linear across the corresponding Nyquist bandwidth of 5 GHz. Instead, the channel has a frequency-dependent response that reduces the amplitude of the higher-frequency portions of the data bandwidth. At higher data rates, the capacitive impedance of the channel causes inter-symbol interference (ISI) and other undesirable effects. To counteract the resulting channel distortion, it is conventional to include equalizers in the transmitting and receiving nodes. An equalizer boosts the high-frequency components of the data signal so that the resulting loss from the capacitive channel impedance at the higher frequencies is addressed. Although equalizers desirably boost the signal amplitudes at high frequencies, their use suffers from a number of problems. For example, conventional equalizers require excessive die space, have relatively low DC gain, limited output voltage swing, and consume too much power.

Accordingly, there is a need in the art for improved equalizer design.

SUMMARY

An equalizer is provided with a pair of load transistors that are effectively diode connected while an instantaneous frequency of a differential input signal is below a boost frequency. When the instantaneous frequency for the differential input signal is at or above the boost frequency, the diode connection is broken to boost a high-frequency gain for the equalizer. When the instantaneous frequency is below the boost frequency, each load transistor loads a corresponding transistor in a differential pair of transistors with a first impedance due to their diode-connected configuration. These diode connections are absent when the instantaneous frequency for the differential input signal is above the boost frequency so that each load transistor loads the corresponding transistor in the differential pair with a second impedance that is higher than the first impedance. A pair of capacitors corresponding to the pair of load transistors controls whether each load transistor is diode connected. At instantaneous frequencies below the boost frequency, each capacitor presents a relatively high impedance to the gate of the corresponding load transistor. This high impedance does not affect the diode connection for the load transistor. At instantaneous frequencies at or above the boost frequency, each capacitor presents a relatively low impedance to the gate of the corresponding load transistor so as to break the corresponding load transistor's diode connection.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A linear equalizer is provided that processes a differential input voltage signal. This differential input signal has a varying instantaneous frequency. For example, in embodiments in which the differential input signal is a data signal, there may be successive bit transitions in which the differential input signal changes polarity for each bit. The instantaneous frequency for the differential input signal would be relatively high during such periods. Depending upon the data content, there will also be periods of time in which the differential input signal does not change polarity for each bit. The instantaneous frequency for the differential input signal would be relatively low at such times. The result is that the differential input signal may have a relatively wide bandwidth such as, for example, 5 GHz. The channel response over such a wide bandwidth will vary as the capacitive losses increase with regard to increasing frequency. To counter these channel losses, the linear equalizer disclosed herein has an increased gain at a relatively-high boost (instantaneous) frequency for the differential input signal. For brevity, the following discussion will denote the instantaneous frequency of the differential input signal as its "frequency."

To provide this frequency-dependent boost in gain, the equalizer includes a differential pair of transistors having their gates driven by the differential input voltage signal. A first one of the differential pair transistors couples in series with a first load transistor. Similarly, a remaining second one of the differential pair transistors couples in series with a second load transistor. With regard to differential input signals below the boost frequency, each load transistor is effectively diode-connected through a corresponding source follower transistor. In particular, each source follower transistor has its source coupled to the gate of the corresponding load transistor and has its gate coupled to the drain of the corresponding load transistor. Since the source voltage "follows" the gate voltage for each source follower transistor, the gate and drain voltages for each load transistor will follow each other accordingly. A pair of capacitors corresponds to the pair of load transistors such that each capacitor couples to the gate of the corresponding load transistor. Each capacitor is configured to form a low-impedance path to the gate of the corresponding load transistor at or above the boost frequency for the differential input voltage.

In contrast, the impedance for each capacitor is increased in the frequency band below the boost frequency. As the impedance for each capacitor drops as the frequency of the differential input signal exceeds the boost frequency, the resulting low-impedance path to the gate of the corresponding load transistor breaks the source follower-induced relationship between the load transistor's gate and drain voltages. The boost frequency at which this source follower-induced relationship between each load transistor's gate and drain voltages is broken corresponds to a zero in the frequency response for the linear equalizer. At differential input signal frequencies below this boost frequency, each load transistor presents a first impedance to its corresponding differential pair transistor that is less than a second impedance presented by each load transistor at differential input signal frequencies above the boost frequency. Each load transistor then presents a significantly greater resistance (or load) to the current flowing though the corresponding differential pair transistor. The gain of the equalizer thus increases at this boost frequency without suffering from the limited output swing, excessive power consumption, or excessive die area demands of prior art approaches. These advantageous features will now be discussed with regard to some example embodiments.

Figure 1A:
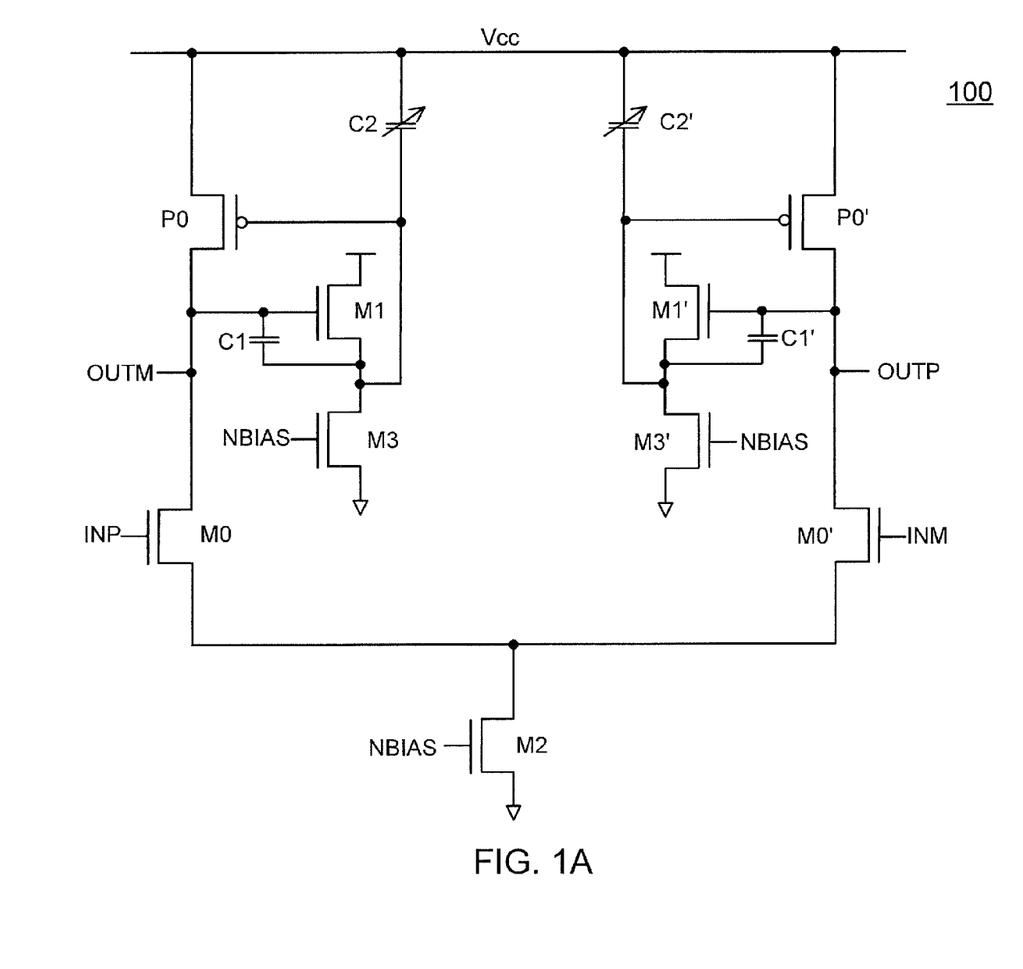
FIG. 1A is a circuit diagram of a linear equalizer having an NMOS differential pair of transistors in accordance with an embodiment of the disclosure.

An example linear equalizer 100 is shown in FIG. 1A. NMOS transistors M0 and M0' form a differential pair of transistors responding to a differential input voltage expressed as the difference between a first input voltage (INP) and a second input voltage (INM). In particular, the INP input voltage drives the gate of differential pair transistor M0 whereas the INM input voltage drives the gate of differential pair transistor M0'. Transistors M0 and M0' steer a tail current generated by an NMOS current source transistor M2. The source of current source transistor M2 couples to ground whereas its drain couples to the sources for the differential pair transistors M0 and M0'. A bias voltage NBIAS drives the gate of current source transistor M2 to set the amount of tail current. As the input voltages INP and INM rise and fall with respect to each other, the tail current is steered accordingly between the differential pair transistors M0 and M0'. For example, if the input voltage INP is higher than the input voltage INM by the threshold voltage for differential pair transistors M0 and M0', virtually all the tail current will flow through differential pair transistor M0. Since differential pair transistor M0' would then be conducting virtually no current, its drain voltage would rise to the power supply voltage VCC. In contrast, the drain voltage of differential pair transistor M0 would drop towards ground (but not discharging all the way to ground because current source M2 requires sufficient headroom to operate). The drains of differential pair transistors M0 and M0' form output nodes for a differential output voltage expressed as the difference between an output voltage OUTM and an output voltage OUTP, respectively.

Differential pair transistor M0 is in series with a corresponding PMOS load transistor P0. Similarly, differential pair transistor M0' is in series with a corresponding PMOS load transistor P0'. In particular, a drain of differential pair transistor M0 couples to a drain of load transistor P0 that has its source tied to a power supply node supplying a power supply voltage VCC. Similarly, the drain of differential pair transistor M0' couples to a drain of load transistor P0' that has its source tied to the power supply node. Through this serial relationship, each load transistor presents an adaptive impedance to the corresponding differential pair transistor depending upon the frequency content in the differential input signal. Differential pair transistors M0 and M0' are matched. Similarly, load transistors P0 and P0' are matched as well.

To provide the adaptive impedance, an NMOS source follower transistor M1 effectively diode connects load transistor P0 with regard to lower frequencies of the differential input signal. In particular, the gate of load transistor P0 couples to the source of source follower transistor M1 whereas the drain of load transistor P0 couples to the gate of source follower transistor M1. The drain of source follower transistor M1 couples to the power supply node supplying the supply voltage VCC. In alternative embodiments, a different power supply voltage may be used to power source follower transistor M1 as compared to that powering the load transistors. The source of source follower transistor M1 couples to the drain of an NMOS current source transistor M3 having its gate biased by the NBIAS bias voltage (in alternative embodiments, current source transistor M3 may be biased by a bias voltage that is independent from the NBIAS voltage used to bias current source transistor M2). A capacitor C2 couples between the source of source follower transistor M1 (and the gate of load transistor P0) and the power supply node. For differential input signals below the boost frequency, capacitor C2 forms a relatively high-impedance path between the gate of load transistor P0 and the power supply node. The gate and drain voltages for load transistor P0 thus follow each other according to the source follower relationship established by source follower transistor M1 for this low-frequency spectral content of the differential input signal. The source of source follower transistor M1 will then follow (by a threshold voltage less than) its gate voltage, which in turn is the drain voltage of load transistor P0. The gate voltage for load transistor P0 is thus maintained at a threshold voltage level below its drain voltage while the differential input frequency is below the boost frequency. This tie between the gate and drain voltages for the low-frequency differential input signal content makes load transistor P0 function as a diode-connected transistor having an impedance of 1/gm (where gm is its transconductance while diode-connected).

When the differential input frequency is at or above the boost frequency, capacitor C2 forms a low-impedance path between the gate of load transistor P0 and the power supply node. This low impedance breaks the diode connection for load transistor P0 such that its gate voltage no longer follows its drain voltage for this higher-frequency spectral content of the differential input signal. Load transistor P0 then presents a significantly higher impedance path between the drain of differential pair transistor M0 and the power supply node. In turn, this higher impedance boosts the gain for linear equalizer 100 at the boost frequency for the differential input voltage. The gate-to-source capacitance Cgs for source follower transistor M1 is represented in FIG. 1 as a separate capacitor C1 for conceptual purposes. The boost frequency corresponds to a zero in the frequency response for linear equalizer 100 that is inversely proportional to a sum of the gate-to-source capacitance Cgs and a capacitance of capacitor C2. As the frequency for the differential input signal continues to go higher, eventually system poles dominate so that the gain decreases. The boost frequency may be made adaptive in embodiments in which capacitor C2 is a variable capacitor such as implemented through a varactor (not illustrated) or other suitable circuits.

A diode connection for a load transistor P0' is analogous. Load transistor P0' has its source tied to the power supply node whereas its drain couples to the drain of differential pair transistor M0'. A source for an NMOS source follower transistor M1' couples to the gate of load transistor P0'. In addition, a capacitor C2' (which may be a variable capacitor similar to capacitor C2) couples between the gate of load transistor P0' and the power supply node. The source of source follower transistor M1' also couples to a drain of an NMOS current source transistor M3' having its gate biased by the bias voltage NBIAS (alternatively, an independent bias voltage may be used as discussed with regard to current source transistor M3). The gate of source follower transistor M1' couples to the drain of load transistor P1', In one embodiment, the collection of the capacitors C2 and C2' and also the source follower transistors forms a means for selectively diode connecting the drain for each load transistor to its gate while an instantaneous frequency for the differential input voltage is below a boost frequency for the equalizer, and for selectively breaking the diode connection for each load transistor while the instantaneous frequency for the differential input voltage is above the boost frequency.

Figure 1B:
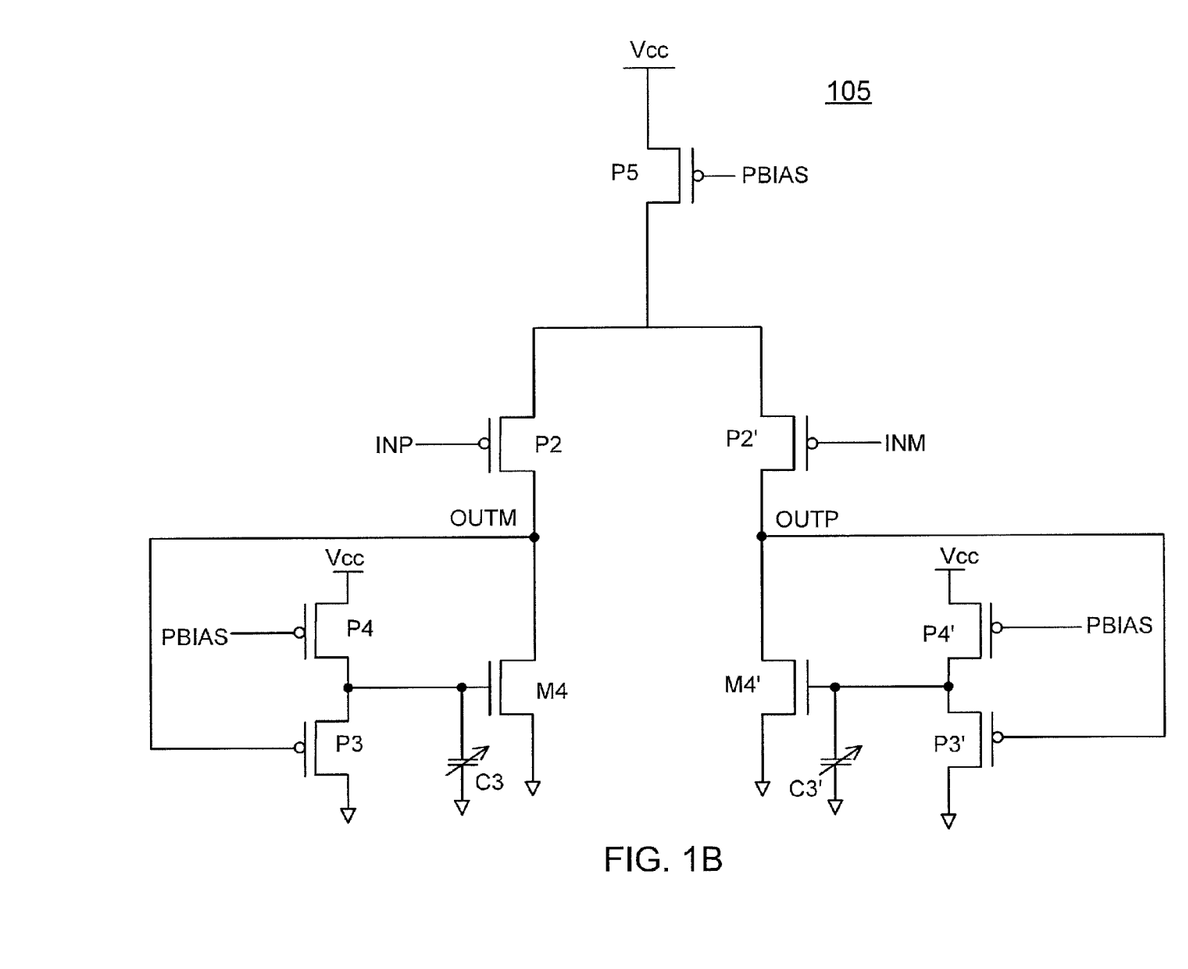
FIG. 1B is a circuit diagram of a linear equalizer having a PMOS differential pair of transistors in accordance with an embodiment of the disclosure.

A complementary embodiment in which the NMOS differential pair of transistors M0 and M0' are replaced by a PMOS differential pair of transistors P2 and P2' is shown for a linear equalizer 105 in FIG. 1B. Transistors P2 and P2' steer a tail current responsive to a differential input voltage. A PMOS current source transistor P5 sources the tail current responsive to a bias voltage PBIAS. Differential pair transistor P2 is in series with an NMOS load transistor M4. Similarly, differential pair transistor P2' is in series with an NMOS load transistor M4'. Load transistor M4 is diode connected through a PMOS source follower transistor P3 that is biased by a PMOS current source transistor P4 having its source coupled to the power supply node and its gate driven by the bias voltage PBIAS. The drain of current source transistor P4 couples to the source of source follower transistor P3. This source for source follower transistor P3 also couples to the gate of load transistor M4. The drain for load transistor M4 couples to the gate of source follower transistor P3. At lower frequencies for the differential input signal, the drain voltage for load transistor M4 equals its gate voltage minus its threshold voltage through source follower transistor P3 such that load transistor P3 is effectively diode connected. At and above the boost frequency, the diode connection is broken because a capacitor C3 forms a low-impedance path between the gate of load transistor M4 and ground.

A PMOS source follower transistor P3' diode connects load transistor M4' analogously. In that regard, a PMOS current source transistor P4' is biased by bias voltage PBIAS to drive a bias current into the source of source follower transistor P3' analogous to how current source transistor P4 biases source follower transistor P3. A capacitor C3' couples between the gate of load transistor M4' and ground analogous to the coupling of capacitor C3 to load transistor M4.

In alternative embodiments, current source transistors P4 and P4' may couple to different power supply voltage as compared to current source transistor P5. Similarly, current source transistors P4 and P4' may be biased by a different bias voltage as compared to the PBIAS voltage. As compared to equalizer 100, the use of a PMOS differential pair of transistors such as P2 and P2' may be advantageous for embodiments in which the DC common mode input voltage is ground. In contrast, a positive DC common mode input voltage may be more suited for the NMOS differential pair M0 and M0' of equalizer 100. To allow for the tuning of the boost frequency, capacitors C3 and C3' may comprise variable capacitors such as implemented through the use of varactors or other suitable circuits.

Figure 2:
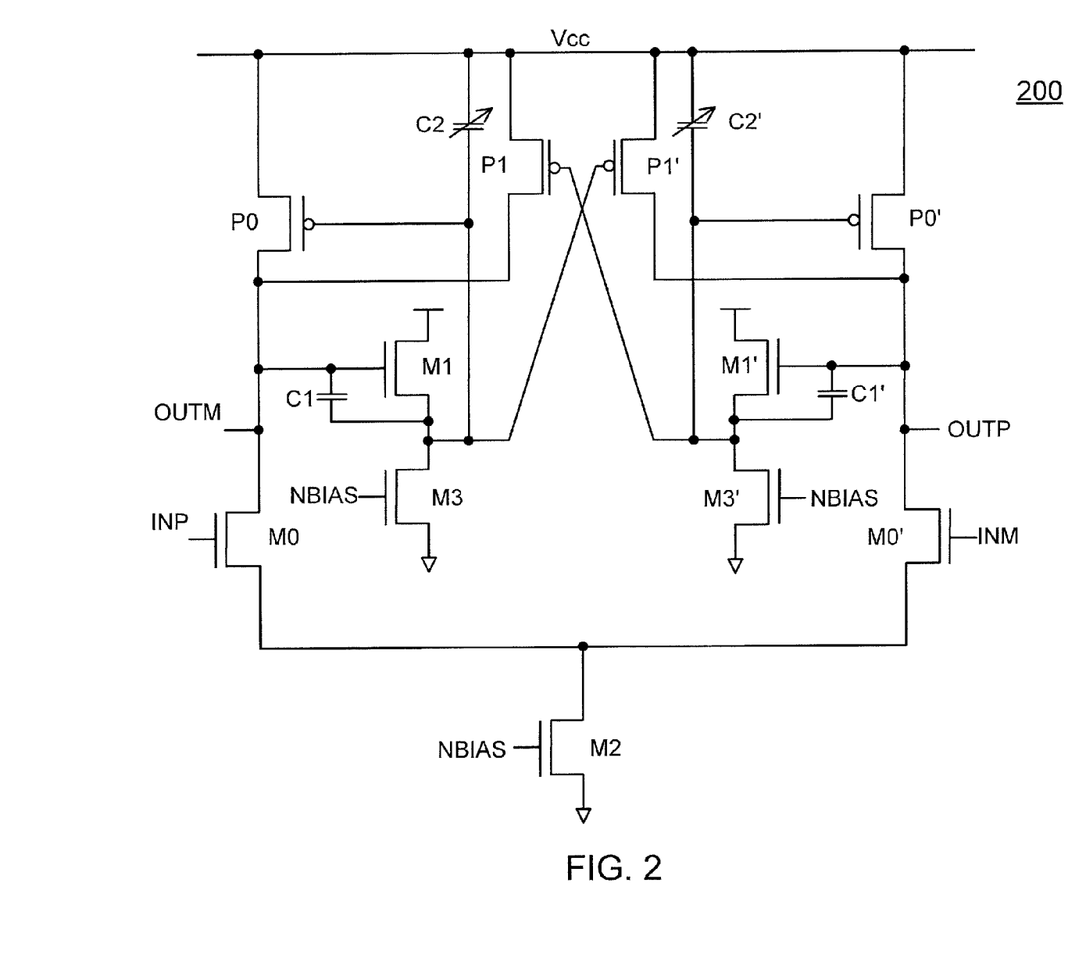
FIG. 2 is a circuit diagram of the linear equalizer of FIG. 1A modified to have increased DC gain.

The following discussion concerns a boosting for the DC gain of equalizer 100 but it will be appreciated that equalizer 105 may be boosted analogously. At DC, the gain for linear equalizer 100 is gm0/gm2, where gm0 is the transconductance for differential pair transistor M0 and gm2 is the transconductance for load transistor P0. To increase the DC gain yet still achieve the desired boosting of high frequencies, equalizer 100 may be modified to include PMOS DC-gain-boosting transistors P1 and P1' as shown for a linear equalizer 200 of FIG. 2. Transistors M0, M1, M2, M3, P0, P0', M0', M1', M2', and M3' as well as capacitors C2 and C2' are configured as discussed with regard to linear equalizer 100. DC-gain-boosting transistor P1 has its source coupled to the power supply node and its drain coupled to the drain of load transistor P0. The gate of DC-gain-boosting transistor P1 is coupled to the gate of the opposing load transistor P0'. DC-gain-boosting transistor P1 will thus conduct a current at DC in opposition to load transistor P0. In particular, suppose that the output voltage OUTP has dropped because the tail current steered between the differential pair of transistors M0 and M0' has steered through transistor M0' and away from transistor M0. Load transistor P0 is then conducting no or relatively little current. But DC-gain-boosting transistor P1 will then tend to be switched on as its gate voltage is capacitively coupled to the output voltage OUTP through the gate-to-source capacitance of source follower transistor M1'. Conversely, as the output voltage OUTP rises, DC-gain-boosting transistor P1 will switch off whereas load transistor P0 will begin to conduct current. DC-gain-boosting transistor P1 thus functions in opposition to load transistor P0. DC-gain-boosting transistor P1' is analogous to DC-gain-boosting transistor P1. DC-gain-boosting transistor P1' thus couples between the power supply node and the drain of load transistor P0' whereas its gate couples to the gate of the opposing load transistor P0. Since DC-gain-boosting transistors P1 and P1' function in opposition to their corresponding load transistors P0 and P0', an effective transconductance gm2' (as compared to their actual transconductance gm2) for the load transistors P0 and P0' is lowered by a transconductance gm3 for the DC-gain-boosting transistors P1 and P1'. In particular, the effective transconductance gm2' equals gm2−gm3. The DC gain for equalizer 200 is proportional to a ratio of gm0/gm2', where gm0 is the transconductance of differential pair transistors M0 and M0'. This DC gain is also proportional to the ratio of the sizes for the load transistor P0 and DC-gain-boosting transistor P1. This ratio may be limited to less than 2:1 in some embodiments to prevent DC-gain-boosting transistors P1 and P1' from forming a latch. Since the DC gain is inversely proportional to the effective transconductance gm2' (which is reduced as compared to the actual transconductance gm2), the DC gain for linear equalizer 200 is boosted as compared to that achieved by linear equalizer 100.

Figure 3:
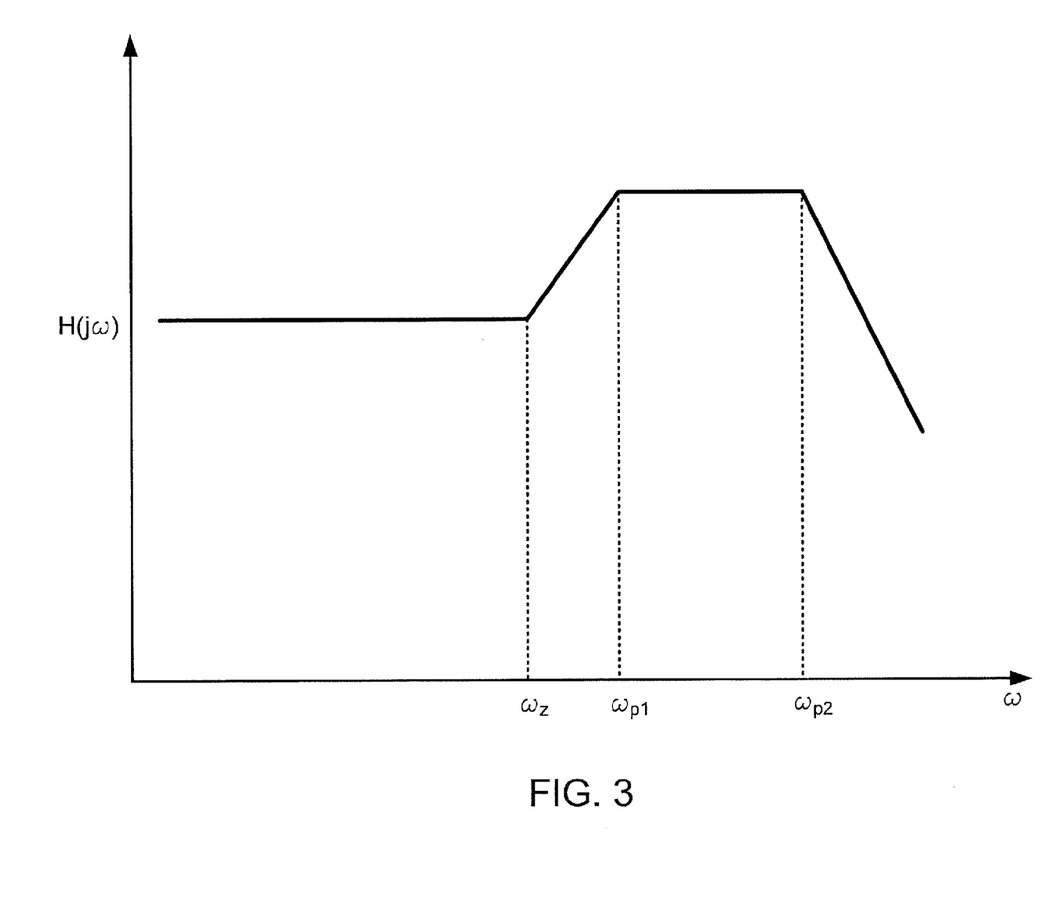
FIG. 3 illustrates the frequency response for a linear equalizer in accordance with an embodiment of the disclosure.

Regardless of whether the DC gain is boosted or not, the high frequency poles and zeros for the linear equalizer frequency response H(jω) for the embodiments disclosed herein may be as shown in FIG. 3. The gain is essentially flat until a zero frequency ωz is reached that equals a ratio gm1/(Cgs+C), where gm1 is the transconductance for the source follower transistor M1 (or P3), Cgs is the gate-to-source capacitance for the source follower transistor, and C is the capacitance of capacitor C2. The gain increases at approximately 20 db per decade until a first pole ωp1 is reached that equals gm1 divided by Cgs. This first pole cancels the gain introduced by the zero such that the gain remains constant until a second system pole ωp2, whereupon the gain decreases at approximately 20 db per decade. The zero is thus inversely proportional to the capacitance C2, which as discussed above may be made variable to allow for a tuning of the zero frequency. Depending upon the channel characteristics, the variable capacitance may be controlled accordingly. Should the high frequency gain boost be needed at lower frequencies, the zero ωz is moved to the left by increasing the variable capacitance. Conversely, the zero ωz is moved to the right by decreasing the variable capacitance. In this fashion, the linear equalizers disclosed herein may advantageously equalize the channel while avoiding the problems discussed above with regard to conventional equalizers. In some embodiments, the effective size of the load transistors or the DC-gain-boosting transistors may be varied by realizing each one as a parallel combination of individually selectable load transistors or DC-gain-boosting transistors. The low frequency gain can then be adjusted through selective activation of the load transistors or the DC-gain-boosting transistors. In this fashion, the low frequency gain may be adjusted independently of the boost frequency tuning.

Figure 4:
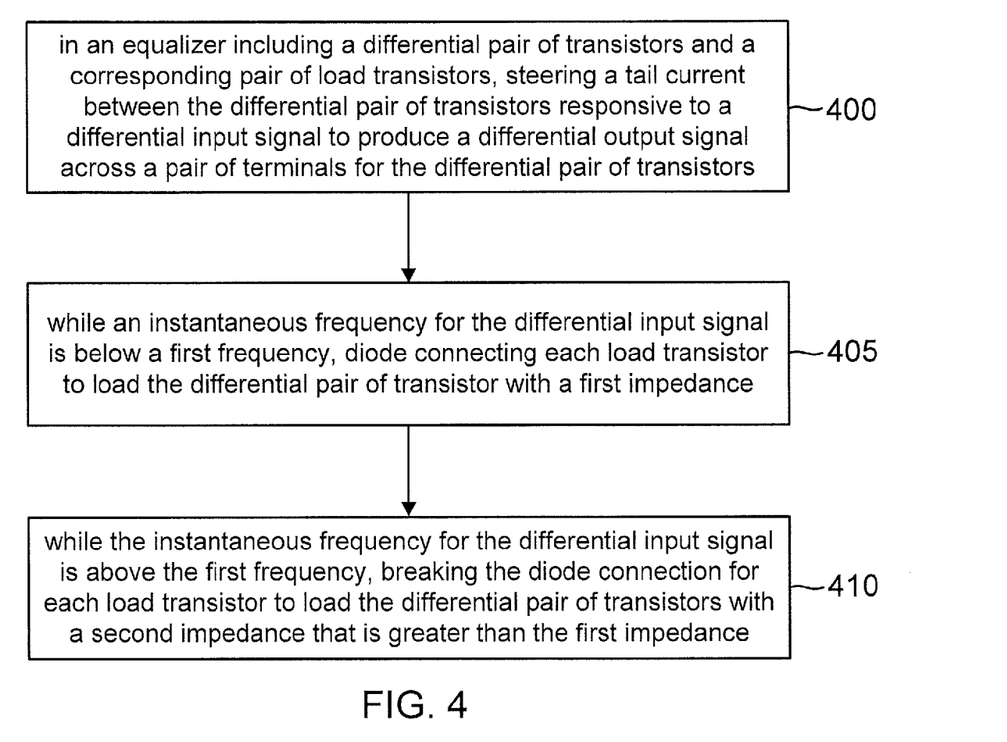
FIG. 4 is a flowchart for a method of operation for a linear equalizer in accordance with an embodiment of the disclosure.

A method of operating a linear equalizer in accordance with embodiments disclosed herein will now be discussed. FIG. 4 is a flowchart for an example method of operation for an equalizer including a differential pair of transistors and a corresponding pair of load transistors. An act 400 comprises steering a tail current between the differential pair of transistor responsive to a differential input signal to produce a differential output signal across a pair of terminals for the differential pair transistors. Steering the tail current from current source transistor M2 through differential pair transistors M0 and M0' responsive to the differential input voltage is an example of act 400. The method also includes an act 405 that occurs while an instantaneous frequency for the differential input signal is below a first frequency. Act 405 comprises diode connecting each load transistor to load the differential pair of transistors with a first impedance. The operation of linear equalizer 100, 105, or 200 while the input frequency is below the zero for the frequency response is an example of act 405. Finally, the method includes an act 410 that occurs while the instantaneous frequency for the differential input signal is above a first frequency. Act 410 comprises breaking the diode connection for each load transistor to load the differential pair of transistors with a second impedance that is higher than the first impedance. The operation of linear equalizer 100, 105, or 200 while the input frequency is greater than the zero for the frequency response is an example of act 410.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

I claim:

1. An equalizer, comprising;
    a current source transistor;
    a differential pair of transistors, wherein a source for each differential pair transistor couples to a terminal for the current source transistor;
    a pair of load transistors corresponding to the differential pair of transistors, each load transistor having a drain coupled to a drain for the corresponding differential pair transistor;
    a pair of capacitors corresponding to the pair of load transistors, each capacitor being coupled between a gate of the corresponding load transistor and a node selected from the group consisting of a power supply node and a ground node; and
    a pair of source follower transistors corresponding to the pair of load transistors, each source follower transistor having a gate coupled to the drain of the corresponding load transistor and having a source coupled to the gate of the corresponding load transistor.

2. The equalizer of claim 1, further comprising a pair of current sources corresponding to the pair of source follower transistors, each current source coupling to a source of the corresponding source follower transistor, each source follower transistor having a drain coupled to the node.

3. The equalizer of claim 1, wherein the terminals for the differential pair of transistors are configured to form output nodes for a corresponding differential output voltage.

4. The equalizer of claim 1, wherein each load transistor comprises a PMOS load transistor.

5. The equalizer of claim 1, further comprising a pair of DC-gain-boosting transistors corresponding to the pair of load transistors, each DC-gain-boosting transistor being configured to respond to a differential input voltage driving the differential pair of transistors by conducting a current in opposition to a current conducted by the corresponding load transistor.

6. The equalizer of claim 5, wherein the node is the power supply node, and wherein the pair of DC-gain-boosting transistors comprises a pair of PMOS DC-gain-boosting transistors each having a source coupled to the power supply node and having a drain coupled to the drain of the corresponding load transistor.

7. The equalizer of claim 5, wherein each DC-gain-boosting transistor has a gate coupled to a gate of an opposing one of the load transistors.

8. The equalizer of claim 1, wherein each load transistor is configured to be diode-connected through the corresponding source follower transistor, and wherein each capacitor is configured to present a low-impedance path to the node that breaks the diode connection for the corresponding load transistor at a zero frequency for the equalizer.

9. The equalizer of claim 1, wherein the node is the ground node.

10. A method of operating an equalizer, comprising:
    in an equalizer including a differential pair of transistors, a current source coupled to a source for each differential pair transistor, and a pair of load transistors corresponding to the differential pair of transistors, each load transistor having a drain coupled to a drain of the corresponding differential pair transistor, steering a tail current from the current source between the differential pair of transistor responsive to a differential input signal to produce a differential output signal across a pair of terminals for the differential pair transistors;

while an instantaneous frequency for the differential input signal is below a first frequency, diode connecting each load transistor to load the differential pair of transistors with a first impedance; and while the instantaneous frequency for the differential input signal is above the first frequency, breaking the diode connection for each load transistor to load the differential pair of transistors with a second impedance that is greater than the first impedance.

11. The method of claim 10, wherein breaking the diode connection for each load transistor comprises forming a low impedance path from a gate for each load transistor to a power supply node through a corresponding capacitor.

12. The method of claim 10, wherein diode connecting each load transistor comprises diode connecting each load transistor through a corresponding source follower transistor.

13. The method of claim 10, further comprising:
boosting a DC gain for the equalizer by lowering an effective transconductance for each load transistor.

14. The method of claim 13, wherein lowering the effective transconductance for each load transistor comprises opposing a differential current conducted by the load transistors.

15. An equalizer, comprising:

a differential pair of transistors configured to steer a tail current responsive to a differential input voltage;

a pair of load transistors corresponding to the differential pair of transistors, each load transistor having a drain coupled to a drain for the corresponding differential pair transistor; and means for selectively diode connecting the drain for each load transistor to its gate while a frequency content for the differential input voltage is below a first frequency for the equalizer, and for selectively breaking the diode connection for each load transistor while the frequency content for the differential input voltage is above the first frequency.

16. The equalizer of claim 15, wherein the means is configured to diode connect each load transistor through a corresponding source follower transistor.

17. The equalizer of claim 16, wherein the means is further configured to break the diode connection for each load transistor through a low impedance path from the gate of each load transistor to a node selected from the group consisting of a power supply node and a ground node.

18. The equalizer of claim 15, wherein the means is further configured to oppose a differential current through each load transistor to boost a DC gain for the equalizer.

* * * * *